(12) United States Patent
Park et al.

(10) Patent No.: US 8,581,380 B2
(45) Date of Patent: Nov. 12, 2013

(54) INTEGRATED CIRCUIT PACKAGING SYSTEM WITH ULTRA-THIN DIE

(75) Inventors: Soo-San Park, Seoul (KR); Sang-Ho Lee, Kyounggi (KR); Jong-Woo Ha, Seoul (KR)

(73) Assignee: Stats Chippac Ltd., Singapore (SG)

( * ) Notice: Subject to any disclaimer, the term of this patent is extended or adjusted under 35 U.S.C. 154(b) by 252 days.

(21) Appl. No.: 11/456,554

(22) Filed: Jul. 10, 2006

(65) Prior Publication Data

US 2008/0006921 A1    Jan. 10, 2008

(51) Int. Cl.
*H01L 23/02* (2006.01)
(52) U.S. Cl.
USPC .......................................... 257/686; 257/777
(58) Field of Classification Search
USPC ............ 257/686, 777, 784, 723, 724, 77, 684
See application file for complete search history.

(56) References Cited

U.S. PATENT DOCUMENTS

| | | | |
|---|---|---|---|
| 4,807,021 A * | 2/1989 | Okumura | 257/777 |
| 4,954,875 A * | 9/1990 | Clements | 257/686 |
| 5,229,647 A * | 7/1993 | Gnadinger | 257/785 |
| 6,162,702 A | 12/2000 | Morcom et al. | |
| 6,239,495 B1 * | 5/2001 | Sakui et al. | 257/777 |
| 6,884,303 B2 | 4/2005 | Francis | |
| 6,910,268 B2 | 6/2005 | Miller | |
| 7,025,665 B2 | 4/2006 | Bender | |
| 7,038,324 B2 | 5/2006 | RamachandraRao et al. | |
| 7,355,273 B2 * | 4/2008 | Jackson et al. | 257/686 |
| 7,589,406 B2 * | 9/2009 | Wood | 257/686 |
| 7,973,310 B2 * | 7/2011 | Wang et al. | 257/48 |
| 2005/0067684 A1 * | 3/2005 | Derderian | 257/686 |
| 2005/0110128 A1 * | 5/2005 | Ahn et al. | 257/686 |
| 2006/0001143 A1 * | 1/2006 | Boon et al. | 257/686 |
| 2006/0006518 A1 * | 1/2006 | Bolken et al. | 257/686 |
| 2006/0131715 A1 * | 6/2006 | Satou et al. | 257/686 |
| 2006/0197211 A1 * | 9/2006 | Miyata et al. | 257/686 |
| 2006/0220208 A1 * | 10/2006 | Onodera et al. | 257/686 |
| 2007/0114648 A1 * | 5/2007 | Karnezos | 257/686 |
| 2007/0158813 A1 * | 7/2007 | Kim | 257/686 |
| 2007/0284139 A1 * | 12/2007 | Chin et al. | 174/260 |
| 2008/0237888 A1 * | 10/2008 | Hayasaka et al. | 257/777 |
| 2010/0320597 A1 * | 12/2010 | Lee et al. | 257/737 |

* cited by examiner

*Primary Examiner* — S. V. Clark
(74) *Attorney, Agent, or Firm* — Ishimaru & Associates LLP; I-Chang John Yang

(57) ABSTRACT

An integrated circuit packaging system with ultra-thin die is provided including providing an ultra-thin integrated circuit stack, having a vertical sidewall contact, including providing a semiconductor wafer having an active side, forming a solder bump on the active side of the semiconductor wafer, forming a support layer over the solder bump and the active side of the semiconductor wafer, forming an ultra-thin wafer from the semiconductor wafer and singulating the ultra-thin integrated circuit stack for exposing the vertical sidewall contact, mounting the ultra-thin integrated circuit stack on a substrate, and coupling the substrate to the vertical sidewall contact.

16 Claims, 6 Drawing Sheets

INTEGRATED CIRCUIT PACKAGING SYSTEM WITH ULTRA-THIN DIE

TECHNICAL FIELD

The present invention relates generally to integrated circuit packaging systems, and more particularly to a system for packaging stacked die from an ultra-thin wafer.

BACKGROUND ART

The commodity electronics of today require more and more function be packed into an ever decreasing space. This trend has given us cellular telephones that can record movies and send them across the internet to be downloaded by a computer, moments after the recording. We also have personal audio/video players that can store thousands of songs or hundreds of music videos. With the shrinking size of devices, the increasing function and commodity pricing, immense pressure is put on the packaging technology to make it all work in less and less space.

There are a number of conventional processes for packaging integrated circuits. In many situations it is desirable to incorporate multiple integrated circuit dice into the same package in what is commonly referred to as a multi-chip package. Some multi-chip packages are arranged to stack two or more dice on top of each other. These stacked die packages have several potentially beneficial aspects including the possibility of a reduced die or package footprint and certain performance aspects (e.g., by reducing the path length of electrical connections between integrated circuits and thus potentially increasing speed and reducing inductance of inter-chip communications).

In order to facilitate the shrinking package size and increasing performance, many of today's designs utilize ultra-thin wafers that are difficult to handle due to their fragility. In a stacked die environment, with ultra-thin die, yield issues have a serious impact on the cost and performance of the finished packages. Semiconductor wafers such as thin monocrystalline silicon wafers are commonly used in semiconductor device fabrication. These wafers can have any desired diameter, for example, 1" to 12" and have varying thicknesses, typically about 300 to 600 microns. The entire wafer is photolithographically processed, receiving on its top surface a large number of spaced sets of diffusions, oxidations, etches, washes, metal layers and the like to form a large number of identical devices such as transistors, diodes, and other such devices. After processing, the wafers are frequently thinned by grinding from the wafer back surface to a thickness desired to satisfy a desired characteristic of the device. The individual devices are then separated by cutting through the wafer.

Many recent semiconductor devices have a need for ultra-thin semiconductor die. For example, Insulated Gate Bipolar Transistors of the "punch-through" type and with a "transparent" collector region and rated at 600 volts or more can be made in wafers about 100 microns thick. Other voltage ratings require even thinner wafers, some as thin as 70 microns. These ultra-thin die require special handling to prevent damage in the package assembly processes. Many of the devices are damaged during the device separation process or fail due to stresses applied to them during the interconnect or die stacking processes. The number of devices used in the commodity electronics devices today demand that 30 to 40% additional devices be manufactured to meet the demand and bridge the yield problems with the ultra-thin semiconductor die. To date the over-manufacture of ultra-thin semiconductor die is accepted as a compromise solution to meet the demand.

Thus, a need still remains for an integrated circuit packaging system with ultra-thin die that can address the fragility of the die and group multiple devices in a single package. In view of the constant advance of technology, with ultra-thin devices and multiple device packages, it is increasingly critical that answers be found to these problems. In view of the ever-increasing commercial competitive pressures, along with growing consumer expectations and the diminishing opportunities for meaningful product differentiation in the marketplace, these problems must be addressed quickly and effectively. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system with ultra-thin die including providing an ultra-thin integrated circuit stack, having a vertical sidewall contact, including providing a semiconductor wafer having an active side and a back side, forming a solder bump on the active side of the semiconductor wafer, forming a support layer over the solder bump and the active side of the semiconductor wafer, forming an ultra-thin wafer from the semiconductor wafer and singulating the ultra-thin integrated circuit stack for exposing the vertical sidewall contact, mounting the ultra-thin integrated circuit stack on a substrate, and coupling the substrate to the vertical sidewall contact.

Certain embodiments of the invention have other aspects in addition to or in place of those mentioned above. The beneficial aspects will become apparent to those skilled in the art from a reading of the following detailed description when taken with reference to the accompanying drawings.

BEST MODE FOR CARRYING OUT THE INVENTION

Figure 1:
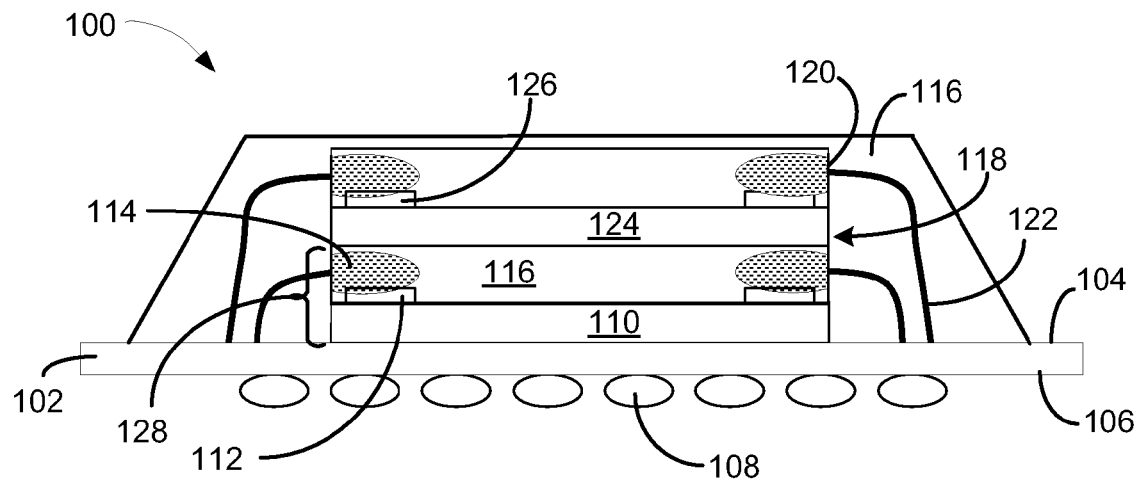
FIG. 1 is a cross-sectional view of an integrated circuit packaging system with ultra-thin die, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described having some features in common, for clarity and ease of illustration, description, and comprehension thereof, like features one to another will ordinarily be described with like reference numerals.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit packaging system 100 with ultra-thin die, in an embodiment of the present invention. The cross-sectional view of the integrated circuit packaging system 100 depicts a substrate 102, having a substrate top 104 and a substrate bottom 106. System interconnects 108, such as solder balls, solder columns, or stud bumps, may be attached to the substrate bottom 106 for connection to the next level system (not shown). A first ultra-thin integrated circuit 110 is attached is attached to the substrate top 104. The first ultra-thin integrated circuit 110 has a first contact pad 112 with an elliptical over-aligned bumped bond pad 114 attached thereon.

An epoxy molding compound 116 encapsulates the elliptical over-aligned bumped bond pad 114, the first contact pad 112, and the top of the first ultra-thin integrated circuit 110. The elliptical over-aligned bumped bond pad 114 is exposed through a vertical sidewall 118 of the epoxy molding compound 116 forming a vertical sidewall contact 120. An electrical interconnect 122, such as a bond wire, couples the elliptical over-aligned bumped bond pad 114, of the first ultra-thin integrated circuit 110, to the substrate top 104.

A second ultra-thin integrated circuit 124 is adhered to the epoxy molding compound 116 over the first ultra-thin integrated circuit 110. The second ultra-thin integrated circuit 124 has a second contact pad 126 with the elliptical over-aligned bumped bond pad 114 attached thereon. The epoxy molding compound 116 encapsulates the elliptical over-aligned bumped bond pad 114, the second contact pad 126, and the top of the second ultra-thin integrated circuit 124. The elliptical over-aligned bumped bond pad 114 is exposed through the vertical sidewall 118 of the epoxy molding compound 116 for interconnect purposes. The electrical interconnect 122, such as the bond wire, couples the elliptical over-aligned bumped bond pad 114, of the second ultra-thin integrated circuit 124, to the substrate top 104. An ultra-thin integrated circuit stack 128 includes the first ultra-thin integrated circuit 110, with the first contact pad 112, the elliptical over-aligned bumped bond pad 114, and the epoxy molding compound 116. The epoxy molding compound 116 encapsulates the first ultra-thin integrated circuit 110, the second ultra-thin integrated circuit 124, the electrical interconnect 122, and a portion of the substrate top 104.

Figure 2:
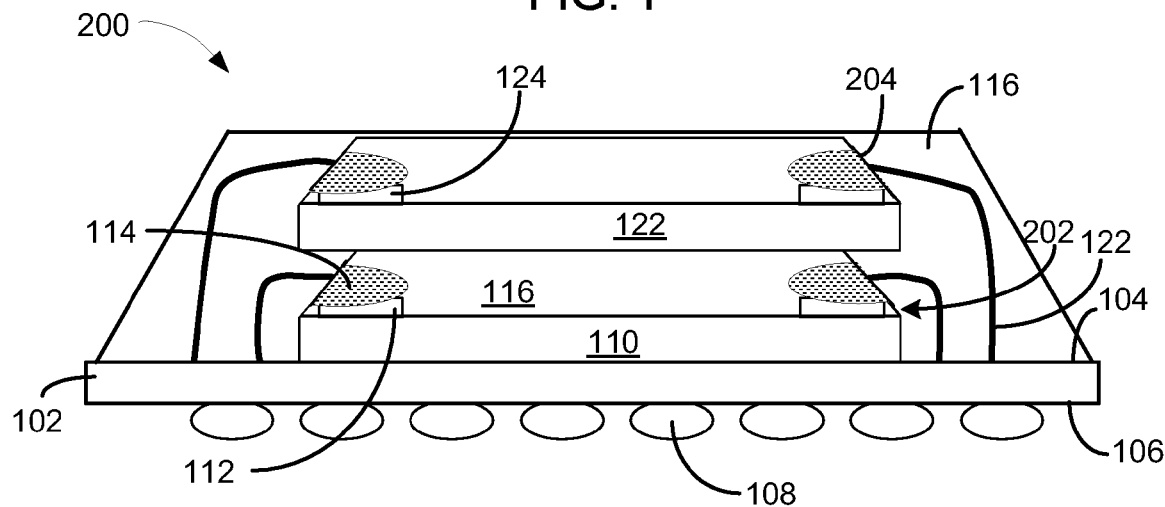
FIG. 2 is a cross-sectional view of the integrated circuit packaging system with ultra-thin die, in an alternative embodiment of the present invention.

Referring now to FIG. 2, therein is shown a cross-sectional view of an integrated circuit packaging system 200 with ultra-thin die, in an alternative embodiment of the present invention. The cross-sectional view of the integrated circuit packaging system 200 depicts the substrate 102, having the substrate top 104 and the substrate bottom 106. The system interconnects may be attached to the substrate bottom 106 for connection to the next level system (not shown). The first ultra-thin integrated circuit 110 is attached is attached to the substrate top 104. The first ultra-thin integrated circuit 110 has the first contact pad 112 with the elliptical over-aligned bumped bond pad 114 attached thereon.

The epoxy molding compound 116 encapsulates the elliptical over-aligned bumped bond pad 114, the first contact pad 112, and the top of the first ultra-thin integrated circuit 110. The elliptical over-aligned bumped bond pad 114 is exposed through an oblique cut surface 202 on the epoxy molding compound 116 forming an oblique sidewall contact 204. The electrical interconnect 122 couples the elliptical over-aligned bumped bond pad 114, of the first ultra-thin integrated circuit 110, to the substrate top 104.

The second ultra-thin integrated circuit 124 is adhered to the epoxy molding compound 116 over the first ultra-thin integrated circuit 110. The second ultra-thin integrated circuit 124 has the second contact pad 126 with the elliptical over-aligned bumped bond pad 114 attached thereon. The epoxy molding compound 116 encapsulates the elliptical over-aligned bumped bond pad 114, the second contact pad 126, and the top of the second ultra-thin integrated circuit 124. The elliptical over-aligned bumped bond pad 114 is exposed through the oblique cut surface 202 of the epoxy molding compound 116 for interconnect purposes. The electrical interconnect 122 couples the elliptical over-aligned bumped bond pad 114, of the second ultra-thin integrated circuit 124, to the substrate top 104. The epoxy molding compound 116 encapsulates the first ultra-thin integrated circuit 110, the second ultra-thin integrated circuit 124, the electrical interconnect 122, and a portion of the substrate top 104.

Figure 3:
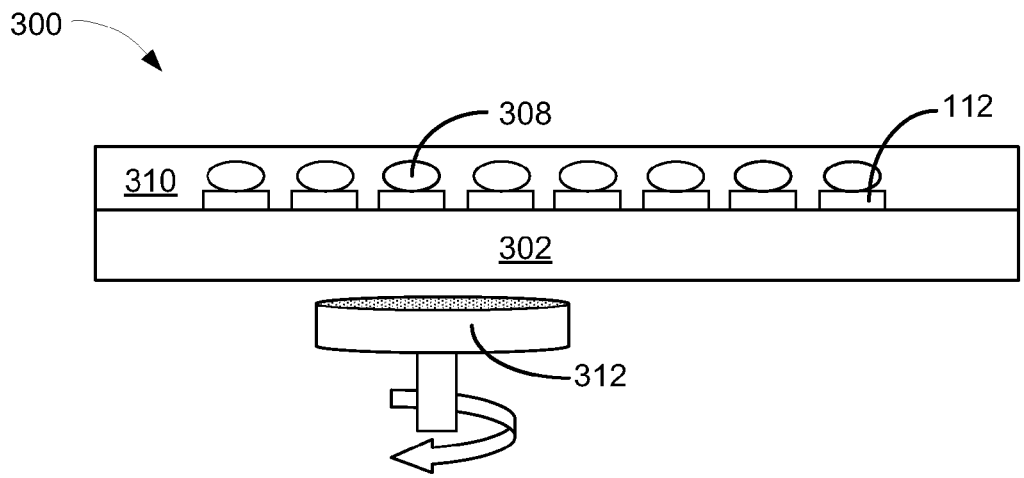
FIG. 3 is a cross-sectional view of a semiconductor wafer in a back-grinding process, in an embodiment of the present invention.

Referring now to FIG. 3, therein is shown a cross-sectional view of a semiconductor wafer 300 in a back-grinding process, in an embodiment of the present invention. The cross-sectional view of the semiconductor wafer 300 depicts an ultra-thin wafer 302 having an active side 304 and a back side 306. The first contact pad 112 is formed on the active side 304 to establish an electrical connection with the integrated circuit (not shown) fabricated on the ultra-thin wafer 302. A solder bump 308 is formed on each of the first contact pad 112. A support layer 310 of the epoxy molding compound 116, of FIG. 1, encapsulates the active side 304 of the ultra-thin wafer 302, the first contact pad 112, and the solder bump 308.

A grinding wheel 312 is used to reduce the thickness of the ultra-thin wafer 302. By having the support layer 310 over the ultra-thin wafer 302, the fragility of the ultra-thin wafer 302 is reduced. The support layer 310 may be added over the solder bumps 308 on a wafer of normal thickness. This process also protects the solder bumps 308 from being knocked off during the handling of the ultra-thin wafer 302. With the solder bumps 308 protected and the ultra thin wafer 302 supported, the back-grinding process may reduce the thickness of the ultra-thin wafer 302 to the maximum deviation of the grinding wheel 312. The current technology may support grinding the ultra-thin wafer 302 to a thickness of substantially 50 μm. This allows the ultra-thin wafer 302 to be handled in the manufacturing process without risk of damage to the ultra-thin wafer 302 or the solder bumps 308, thus improving yields and reducing costs.

Figure 4:
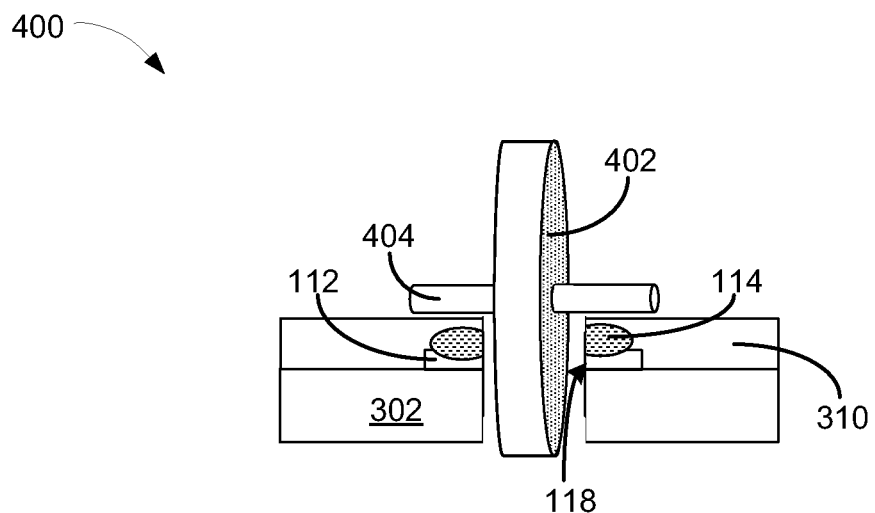
FIG. 4 is a cross-sectional view of a vertical cut singulation saw in a device singulation process, in an embodiment of the present invention.

Referring now to FIG. 4, therein is shown a cross-sectional view of a vertical cut singulation saw 400 in a device singulation process, in an embodiment of the present invention. The cross-sectional view of the vertical cut singulation saw 400 depicts a vertical cut blade 402 on a saw axel 404. The vertical cut blade 402 is used to separate the individual integrated circuits (not shown) on the ultra-thin wafer 302. The singulation zone between individual integrated circuits (not shown) is called the saw street. The first contact pad 112 is aligned on both sides of the saw street. The elliptical over-aligned bumped bond pad 114 and the support layer 310 extend into the saw street, so that a portion of the elliptical over-aligned bumped bond pad 114 and the surrounding region of the support layer 310 are removed by the vertical cut blade 402. When the cut is completed, a portion of the elliptical over-aligned bumped bond pad 114 is exposed on the vertical sidewall 118.

Figure 5:
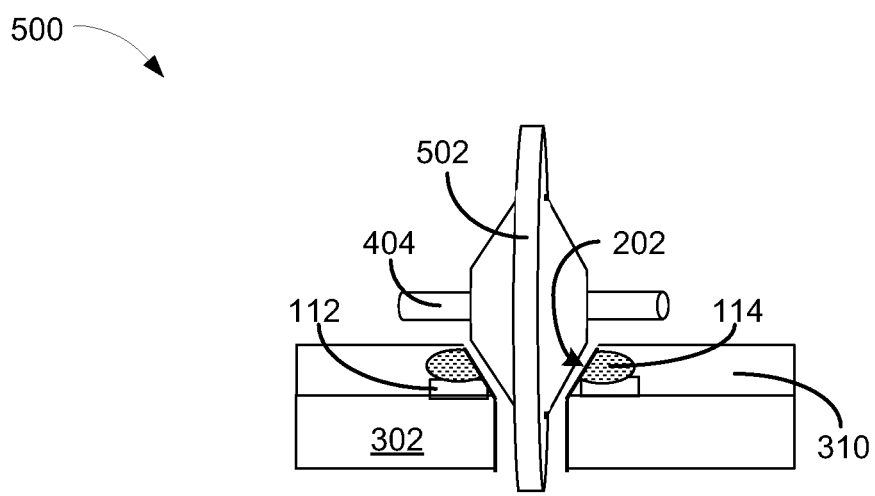
FIG. 5 is a cross-sectional view of an oblique cut singulation saw in a device singulation process, in an alternative embodiment of the present invention.

Referring now to FIG. 5, therein is shown a cross-sectional view of an oblique cut singulation saw 500 in a device singulation process, in an alternative embodiment of the present invention. The cross-sectional view of the oblique cut singulation saw 500 depicts an oblique cut saw blade 502 on the saw axel 404. The oblique cut saw blade 502 is used to separate the individual integrated circuits (not shown) on the ultra-thin wafer 302. The singulation zone between individual integrated circuits (not shown) is called the saw street. The first contact pad 112 is aligned on both sides of the saw street. The elliptical over-aligned bumped bond pad 114 and the support layer 310 extend into the saw street, so that a portion of the elliptical over-aligned bumped bond pad 114 and the surrounding region of the support layer 310 are removed by the oblique cut saw blade 502. When the cut is completed, a portion of the elliptical over-aligned bumped bond pad 114 is exposed on the oblique cut surface 202.

Figure 6:
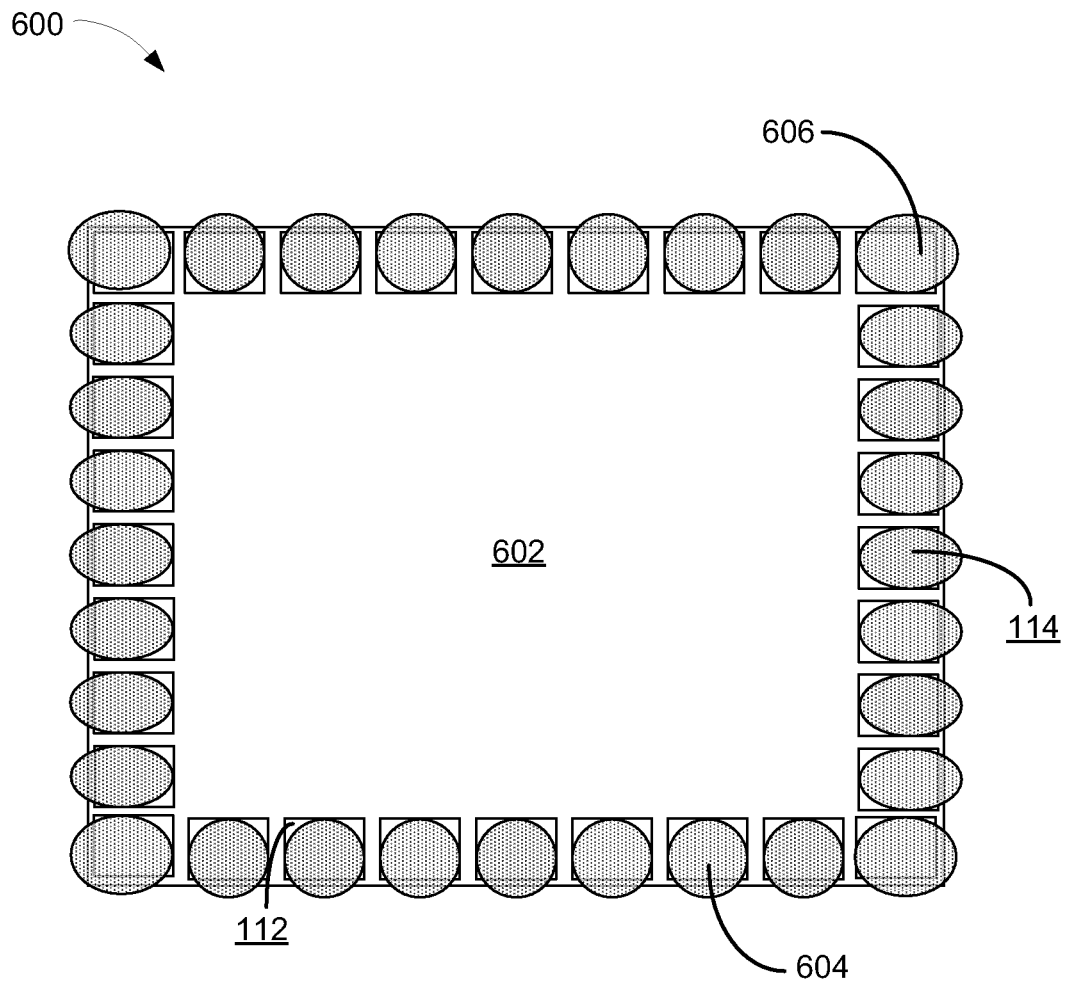
FIG. 6 is a top view of an integrated circuit with bumped bond pads, in an embodiment of the present invention.

Referring now to FIG. 6, therein is shown a top view of an integrated circuit 600 with bumped bond pads, in an embodiment of the present invention. The top view of the integrated circuit 600 depicts an integrated circuit die 602 having a row of the first contact pad 112 aligned around the edges of the integrated circuit die 602. The first contact pad 112 has one of three types of the bumped bond pad. A normal bumped bond pad 604 is coupled to two of the rows of the first contact pad 112 on opposite sides of the integrated circuit die 602. The elliptical over-aligned bumped bond pad 114 is positioned on the other two rows of the first contact pad 112 on opposite sides of the integrated circuit die 602. An elliptical over-sized bumped bond pad 606 is coupled in each of the corners of the integrated circuit die 602. An integrated circuit edge 608 represents the edge of the saw street around the integrated circuit 600.

Figure 7:
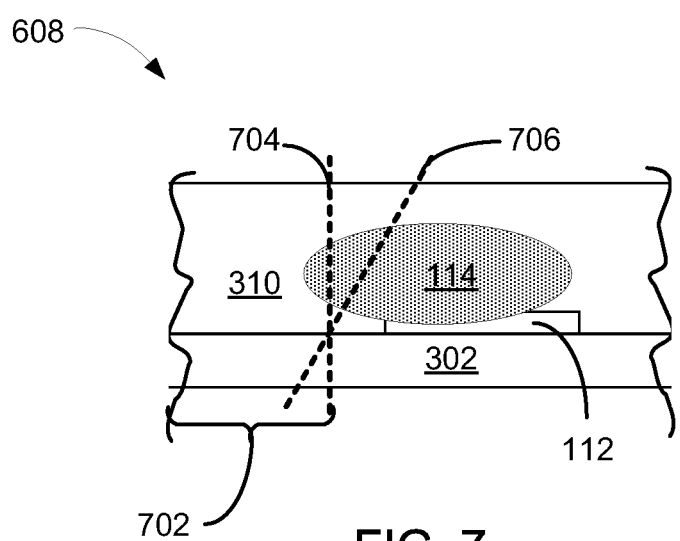
FIG. 7 is an enlarged cross-sectional view of the integrated circuit edge having the elliptical over-aligned bumped bond pad with singulation angles shown.

Referring now to FIG. 7, therein is shown an enlarged cross-sectional view of the integrated circuit edge 608 having the elliptical over-aligned bumped bond pad 114 with singulation angles shown. The enlarged cross-sectional view of the integrated circuit edge 608 depicts the ultra-thin wafer 302 having the elliptical over-aligned bumped bond pad 114 coupled to the first contact pad 112. A saw street 702 is aligned outside of the integrated circuit boundary. The saw street 702 is the region on the semiconductor wafer 300, of FIG. 3, that is sacrificed during the singulation process. The material in this region is removed by the vertical cut blade 402, of FIG. 4. A vertical boundary line 704 indicates the singulated edge of the first ultra-thin integrated circuit 110.

An oblique boundary line 706 indicates the singulated edge of the first ultra-thin integrated circuit 110, when the oblique cut saw blade 502 is used. The oblique cut saw blade 502 exposes a larger surface of the elliptical over-aligned bumped bond pad 114. Either the vertical boundary line 704 forming a non-horizontal sidewall contact 120 of FIG. 1 such as the vertical sidewall contact 120 or the oblique boundary line 706 forming the non-horizontal sidewall contact 204 of FIG. 2 such as the oblique sidewall contact 204 will present a contact region suitable for electrical connection from the non-horizontal sidewall contact 204 exposed from a perimeter of the support layer 310.

Figure 8:
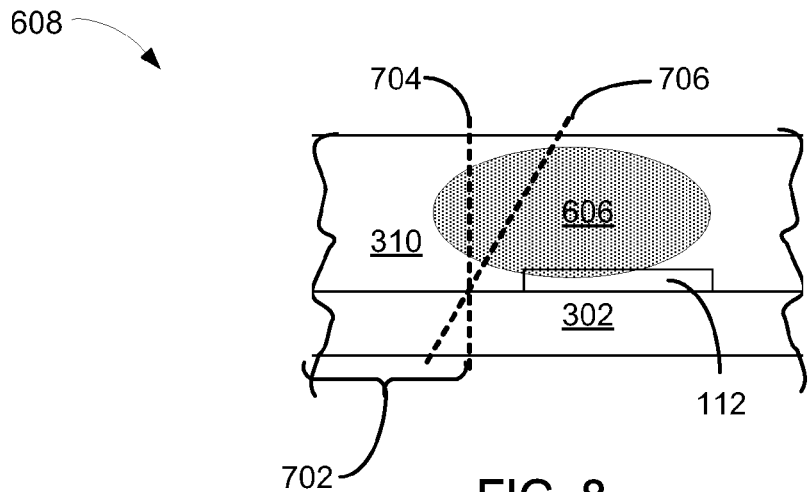
FIG. 8 is an enlarged cross-sectional view of the integrated circuit edge having an elliptical over-sized bumped bond pad with singulation angles shown.

Referring now to FIG. 8, therein is shown an enlarged cross-sectional view of the integrated circuit edge 608 having the elliptical over-sized bumped bond pad 606 with singulation angles shown. The enlarged cross-sectional view of the integrated circuit edge 608 depicts the ultra-thin wafer 302 having the elliptical over-sized bumped bond pad 606 coupled to the first contact pad 112. The saw street 702 is aligned outside of the integrated circuit boundary. The saw street 702 is the region on the semiconductor wafer 300, of FIG. 3, that is sacrificed during the singulation process. The material in this region is removed by the vertical cut blade 402, of FIG. 4. The vertical boundary line 704 indicates the singulated edge of the first ultra-thin integrated circuit 110.

The oblique boundary line 706 indicates the singulated edge of the first ultra-thin integrated circuit 110, when the oblique cut saw blade 502 is used. The oblique cut saw blade 502 exposes a larger surface of the elliptical over-sized bumped bond pad 606. Either the vertical boundary line 704 or the oblique boundary line 706 will present a contact region suitable for electrical connection.

Figure 9:
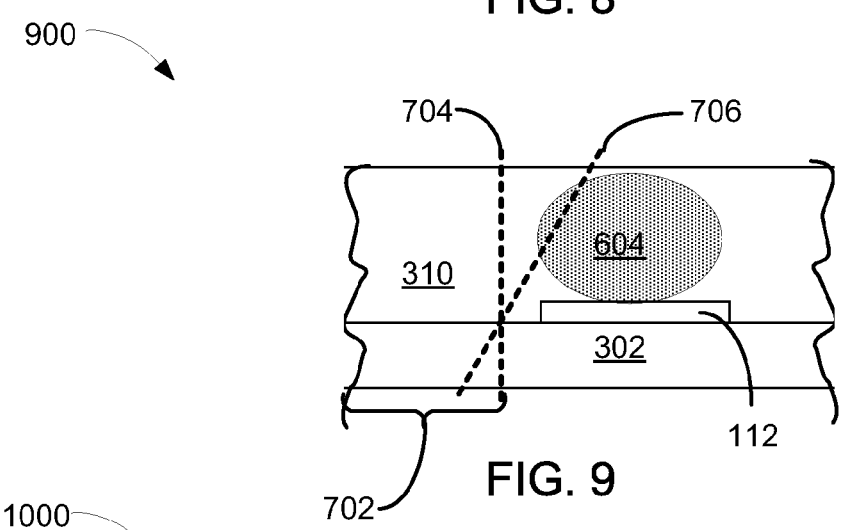
FIG. 9 is an enlarged cross-sectional view of the integrated circuit edge having a normal bumped bond pad with singulation angles shown.

Referring now to FIG. 9, therein is shown an enlarged cross-sectional view of the integrated circuit edge 608 having the normal bumped bond pad 604 with singulation angles shown. The enlarged cross-sectional view of the integrated circuit edge 608 depicts the ultra-thin wafer 302 having the normal bumped bond pad 604 coupled to the first contact pad 112. The saw street 702 is aligned outside of the integrated circuit boundary. The saw street 702 is the region on the semiconductor wafer 300, of FIG. 3, that is sacrificed during the singulation process. The material in this region is removed by the vertical cut blade 402, of FIG. 4. The vertical boundary line 704 indicates the singulated edge of the first ultra-thin integrated circuit 110. In this case, the vertical cut blade 402 would not expose an electrical contact on the normal bumped bond pad 604.

The oblique boundary line 706 indicates the singulated edge of the first ultra-thin integrated circuit 110, when the oblique cut saw blade 502 is used. The oblique cut saw blade 502 exposes a suitable surface of the normal bumped bond pad 604. When the normal bumped bond pad 604 is used, the oblique cut saw blade 502 is the only suitable singulation device to expose viable electrical contacts.

Figure 10:
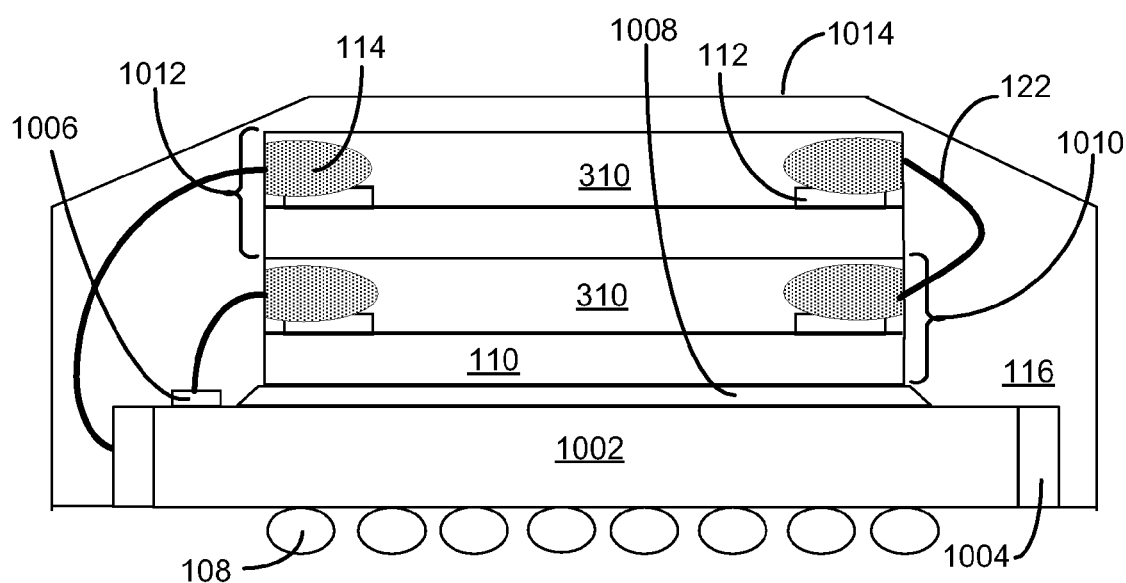
FIG. 10 is a cross-sectional view of an integrated circuit packaging system having a die side connection.

Referring now to FIG. 10, therein is shown a cross-sectional view of an integrated circuit packaging system 1000 having an integrated circuit side connection. The cross-sectional view of the integrated circuit packaging system 1000 depicts a metalized substrate 1002 having a metal side contact 1004, such as a gold contact, and a metal top contact 1006 of similar material to the metal side contact 1004. The system interconnects 108 are coupled to the system side of the metalized substrate 1002. An adhesive 1008, such as a die attach material, is applied on the metalized substrate 1002 adjacent to the metal top contact 1006.

A first ultra-thin integrated circuit stack 1010 is mounted on the adhesive 1008. The first ultra-thin integrated circuit stack 1010 includes the first ultra-thin integrated circuit 110, having the first contact pad 112, the elliptical over-aligned bumped bond pad 114, and the support layer 310. A second ultra-thin integrated circuit stack 1012 is mounted on the first ultra-thin integrated circuit stack 1010. The electrical interconnect 122 may be used to couple the first ultra-thin integrated circuit stack 1010 to the second ultra-thin integrated circuit stack 1012 in a side to side connection. The electrical interconnect 122 may also be used to couple the first ultra-thin integrated circuit stack 1010 side to the metal top contact 1006 and the second ultra-thin integrated circuit stack 1012 coupled to the metal side contact 1004. The epoxy molding compound 116 encapsulates the metalized substrate 1002, the electrical interconnect 122, the first ultra-thin integrated circuit stack 1010, and the second ultra-thin integrated circuit stack 1012 forming a cover 1014.

Figure 11:
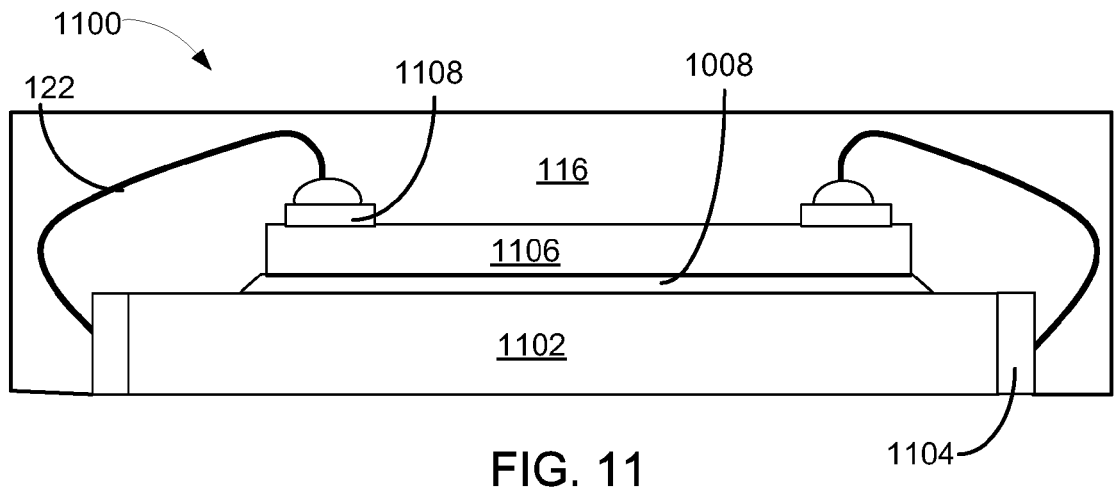
FIG. 11 is a cross-sectional view of an integrated circuit packaging system having a substrate side connection.

Referring now to FIG. 11, therein is shown a cross-sectional view of an integrated circuit packaging system 1100 having a substrate side connection. The a cross-sectional view of the integrated circuit packaging system 1100 depicts a metalized substrate 1102 having metal side contacts 1104 with the adhesive 1008 on the metalized substrate 1102. An integrated circuit 1106, having bonding contacts 1108, is mounted on the adhesive 1008. The electrical interconnect 122 are coupled between the bonding contacts 1108 and the metal side contacts 1104. The epoxy molding compound 116 encapsulates the metalized substrate 1102, the integrated circuit 1106 and the electrical interconnect 122.

Figure 12:
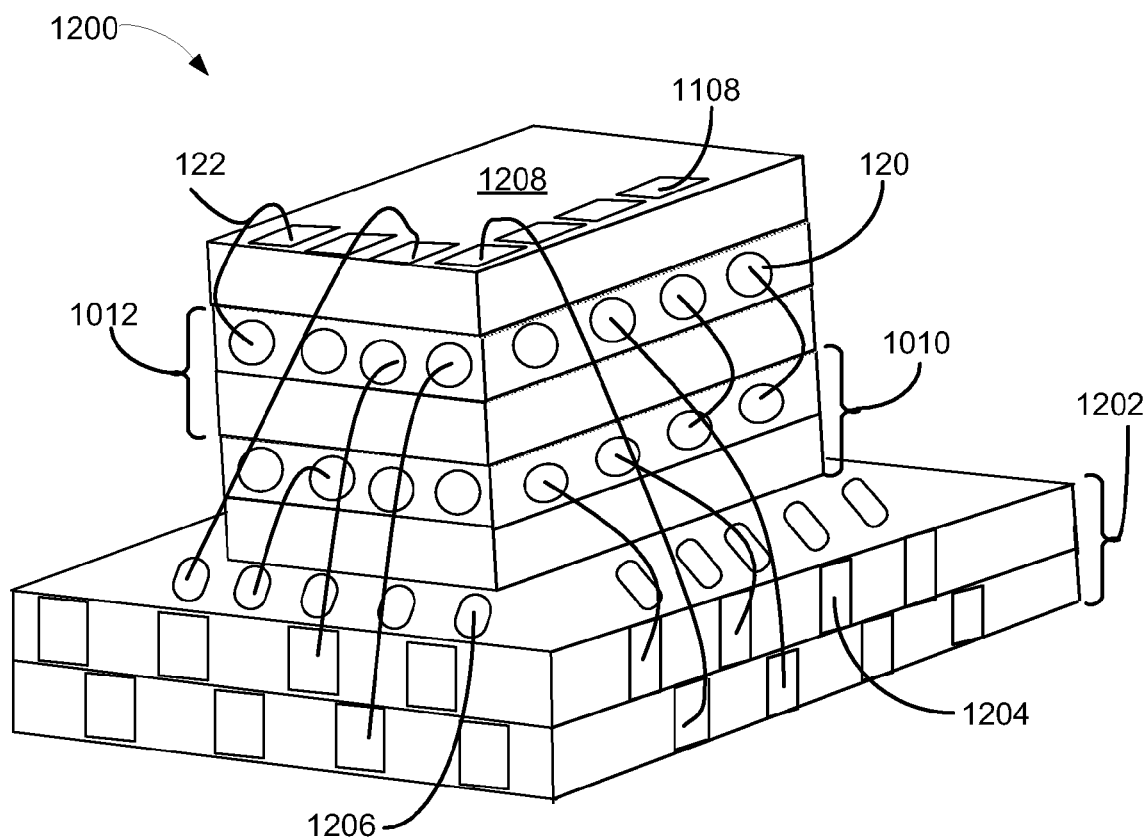
FIG. 12 is a cross-sectional view of an integrated circuit packaging system having multiple connection options.

Referring now to FIG. 12, therein is shown a cross-sectional view of an integrated circuit packaging system 1200 having multiple connection options. The cross-sectional view of the integrated circuit packaging system 1200 depicts a multiple layer substrate 1202 having staggered metal side contacts 1204 and metal top contacts 1206. The first ultra-thin integrated circuit stack 1010 is mounted on the multiple layer substrate 1202. The second ultra-thin integrated circuit stack 1012 is mounted on the first ultra-thin integrated circuit stack 1010, with a standard integrated circuit 1208, with the bonding contacts 1108, mounted over the second ultra-thin integrated circuit stack 1012. The vertical sidewall contact 120 on the first ultra-thin integrated circuit stack 1010 and the second ultra-thin integrated circuit stack 1012 may be used to establish electrical connections to other components. The electrical interconnect 122 may provide the coupling between the bonding contacts 1108, the vertical sidewall contact 120, the metal top contacts 1206 and the staggered metal side contacts 1204.

Figure 13:
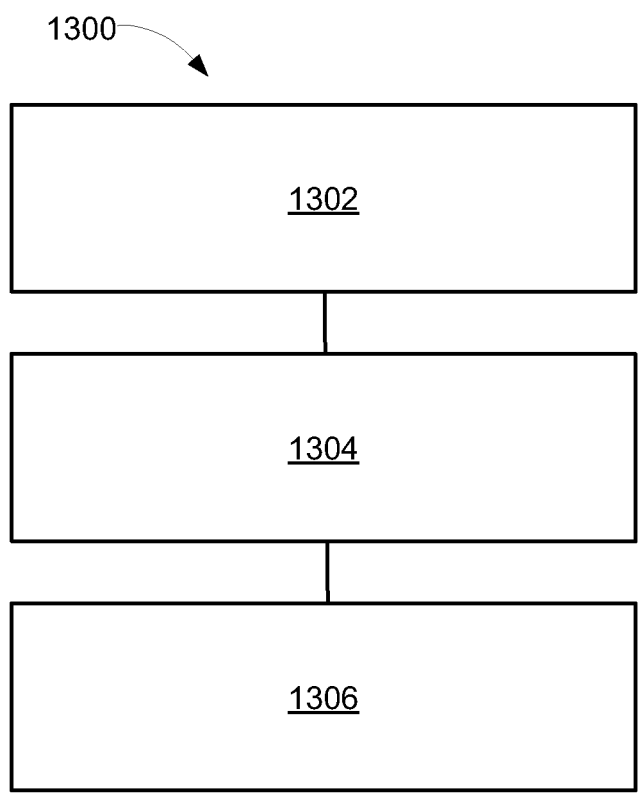
FIG. 13 is a flow chart of an integrated circuit packaging system with ultra-thin die for manufacturing the integrated circuit packaging system with ultra-thin die, in an embodiment of the present invention.

Referring now to FIG. 13, therein is shown a flow chart of an integrated circuit packaging system 1300 with ultra-thin die for manufacturing the integrated circuit packaging system 100 with ultra-thin die in an embodiment of the present invention. The system 1300 includes providing an ultra-thin integrated circuit stack, having a vertical sidewall contact, including providing a semiconductor wafer having an active side, forming a solder bump on the active side of the semiconductor wafer, forming a support layer over the solder bump and the active side of the semiconductor wafer, forming an ultra-thin wafer from the semiconductor wafer and singulating the ultra-thin integrated circuit stack for exposing the vertical sidewall contact in a block 1302; mounting the ultra-thin integrated circuit stack on a substrate in a block 1304; and coupling the substrate to the vertical sidewall contact in a block 1306.

It has been discovered that the present invention thus has numerous aspects.

It has been unexpectedly discovered that by adding the support layer over a pre-bumped wafer, the back-grinding process may be pushed to the maximum deviation of the back grinding machine. The support layer also protects the bumps during handling in the assembly process.

A principle aspect is that the present invention by enabling a side contact on the integrated circuit, shorter interconnects are possible allowing increases in performance.

Another aspect is that the side interconnect allows for shorter packages. This aspect is beneficial in commodity electronic environments where space is at a premium.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system with ultra-thin die, of the present invention furnishes important and heretofore unknown and unavailable solutions, capabilities, and functional aspects for integrated circuit packaging with stacked die. The resulting processes and configurations are straightforward, cost-effective, uncomplicated, highly versatile and effective, can be implemented by adapting known technologies, and are thus readily suited for efficiently and economically manufacturing integrated circuit devices with stacked ultra-thin die fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:
1. An integrated circuit package comprising:
a substrate having a substrate top and a substrate bottom;
a first ultra-thin integrated circuit attached to the substrate top, the first ultra-thin integrated circuit having a first contact pad with a first elliptical over-aligned bump bond pad attached thereon;

a second ultra-thin integrated circuit over the first ultra-thin integrated circuit, the second ultra-thin integrated circuit having a second contact pad with a second elliptical over-aligned bump bond pad attached thereon;

an epoxy molding compound operable to encapsulate the first ultra-thin integrated circuit and the first contact pad, and the second ultra-thin integrated circuit and the second contact pad, wherein a vertical sidewall of the epoxy molding compound exposes the first elliptical over-aligned bump bond pad and the second elliptical over-aligned bump bond pad;

a first electrical interconnect coupled for the first elliptical over-aligned bump bond pad through the vertical sidewall directly to the substrate top; and a second electrical interconnect coupled from the second elliptical over-aligned bump bond pad through the vertical sidewall directly to the substrate top.

2. The package as claimed in claim 1, wherein:
the first electrical interconnect is a first bond wire, and
the second electrical interconnect is a second bond wire.

3. The package as claimed in claim 1, further comprising:
system interconnects attached to the substrate bottom.

4. The package as claimed in claim 3, wherein the system interconnects include solder balls, solder columns or stud bumps.

5. An integrated circuit package comprising:
a first metalized substrate having a first metal side contact;
a second metalized substrate over the first metalized substrate, the second metalized substrate having a second metal side contact, wherein the second metal side contact and the first metal side contact have a staggered configuration;
a first ultra-thin integrated circuit stack mounted over the first metalized substrate and the second metalized substrate, wherein the first ultra-thin integrated circuit stack includes:
   a first ultra-thin integrated circuit having a first contact pad with a first elliptical over-aligned bump pad attached thereon; and
   an epoxy molding compound operable to encapsulate the first ultra-thin integrated circuit and the first contact pad, wherein a vertical sidewall of the epoxy molding compound exposes the first elliptical over-aligned bump bond pad; and
a first electrical interconnect coupled from the first ultra-thin integrated circuit through the vertical sidewall to at least one of:
   the first metal side contact, and
   the second metal side contact.

6. The package as claimed in claim 5, wherein:
the second metalized substrate includes top metal contact, where the top metal contact and the second metal side contact and the first metal side contact have the staggered configuration; and
the first electrical interconnect is coupled from the first ultra-thin integrated circuit through the vertical sidewall to the top metal contact.

7. The package as claimed in claim 6, further comprising:
a second ultra-thin integrated circuit stack mounted over the first ultra-thin integrated circuit stack, wherein the second ultra-thin integrated circuit stack includes:
   a second ultra-thin integrated circuit having a second contact pad with a second elliptical over-aligned bump pad attached thereon; and
   wherein the epoxy molding compound is operable to encapsulate the second ultra-thin integrated circuit and the second contact pad, wherein the vertical sidewall of the epoxy molding compound exposes the second elliptical over-aligned bump bond pad; and
a second electrical interconnect coupled from the second ultra-thin integrated circuit through the vertical sidewall to at least one of:
   the first ultra-thin integrated circuit through the vertical sidewall,
   the first metal side contact,
   the second metal side contact, and
   the top metal contact.

8. The package as claimed in claim 7, further comprising:
an integrated circuit mounted over the second ultra-thin integrated circuit stack and the first ultra-thin integrated circuit stack, wherein the integrated circuit includes a bonding contact; and
a third electrical interconnect coupled from the bonding contact to at least one of:
   the first ultra-thin integrated circuit through the vertical sidewall,
   the second ultra-thin integrated circuit through the vertical sidewall,
   the first metal side contact,
   the second metal side contact, and
   the top metal contact.

9. The package as claimed in claim 8, wherein the first metal side contact is a first gold contact, the second metal side contact is a second gold contact, and the top metal contact is a third gold contact.

10. The package as claimed in claim 8, wherein
the first electrical interconnect is a first bond wire,
the second electrical interconnect is a second bond wire, and
the third electrical interconnect is a third bond wire.

11. The package as claimed in claim 8, further comprising:
system interconnects attached to the bottom of the first metalized substrate.

12. The package as claimed in claim 11, wherein the system interconnects include solder balls, solder columns or stud bumps.

13. An integrated circuit package comprising:
a substrate having a substrate top and a substrate bottom;
a first ultra-thin integrated circuit attached to the substrate top, the first ultra-thin integrated circuit having a first contact pad with a first elliptical over-aligned bump bond pad attached thereon;
a second ultra-thin integrated circuit over the first ultra-thin integrated circuit, the second ultra-thin integrated circuit having a second contact pad with a second elliptical over-aligned bump bond pad attached thereon;
an epoxy molding compound operable to encapsulate the first ultra-thin integrated circuit and the first contact pad, and the second ultra-thin integrated circuit and the second contact pad,
   wherein a first oblique cut surface of the epoxy molding compound exposes the first elliptical over-aligned bump bond pad, and
   wherein a second oblique cut surface of the epoxy molding compound exposes the second elliptical over-aligned bump bond pad;
a first electrical interconnect coupled from the first elliptical over-aligned bump bond pad through the first oblique cut surface directly to the substrate top; and
a second electrical interconnect coupled from the second elliptical over-aligned bump bond pad through the second oblique cut surface directly to the substrate top.

14. The package as claimed in claim 13, wherein:
the first electrical interconnect is a first bond wire, and
the second electrical interconnect is a second bond wire.

15. The package as claimed in claim 13, further comprising:
system interconnects attached to the substrate bottom.

16. The package as claimed in claim 15, wherein the system interconnects include solder balls, solder columns or stud bumps.

\* \* \* \* \*

UNITED STATES PATENT AND TRADEMARK OFFICE
CERTIFICATE OF CORRECTION

PATENT NO. : 8,581,380 B2  
APPLICATION NO. : 11/456554  
DATED : November 12, 2013  
INVENTOR(S) : Park et al.

Page 1 of 1

It is certified that error appears in the above-identified patent and that said Letters Patent is hereby corrected as shown below:

In the Claims:

Column 9, claim 1, line 12, delete "coupled for" and insert therefor --coupled from--

Signed and Sealed this  
Third Day of November, 2015

Michelle K. Lee  
*Director of the United States Patent and Trademark Office*